United States Patent
Frey et al.

[11] Patent Number: 5,249,101
[45] Date of Patent: Sep. 28, 1993

[54] CHIP CARRIER WITH PROTECTIVE COATING FOR CIRCUITIZED SURFACE

[75] Inventors: Brenda D. Frey, Binghamton; Charles A. Joseph, Candor; Francis J. Olshefski, Endicott; James W. Wilson, Vestal, all of N.Y.

[73] Assignee: International Business Machines, Armonk, N.Y.

[21] Appl. No.: 909,368

[22] Filed: Jul. 6, 1992

[51] Int. Cl.[5] .............................................. H05K 7/20
[52] U.S. Cl. ................................ 361/717; 174/52.2; 228/214; 257/738; 257/759; 264/272.17; 428/901; 437/211
[58] Field of Search ............... 257/706, 707, 713, 717, 257/738, 746, 747, 759; 361/383, 386–389, 400–405, 421; 174/52.2, 52.4; 264/272, 171; 228/180.1, 180.2, 214; 437/211, 219; 428/76, 411.1, 422.8, 473.5, 901

[56] References Cited

U.S. PATENT DOCUMENTS

| | | | |
|---|---|---|---|
| 4,582,862 | 4/1986 | Berner et al. | 522/14 |
| 4,633,573 | 1/1987 | Scherer | 29/589 |
| 4,784,872 | 11/1988 | Moeller | 437/211 |
| 4,806,574 | 2/1989 | Krajewski et al. | 522/96 |
| 4,973,611 | 11/1990 | Puder | 522/42 |
| 4,985,523 | 1/1991 | Mochizuki et al. | 526/301 |
| 4,992,547 | 2/1991 | Berner et al. | 544/162 |
| 4,999,699 | 3/1991 | Christie et al. | 357/65 |
| 5,039,715 | 8/1991 | Bachmann et al. | 522/13 |
| 5,053,357 | 10/1991 | Lin | 437/211 |
| 5,089,440 | 2/1992 | Christie | 437/209 |
| 5,120,678 | 6/1992 | Moore | 437/211 |
| 5,121,190 | 6/1992 | Hsiao | 357/80 |
| 5,128,746 | 7/1992 | Pennisi | 357/72 |
| 5,173,764 | 12/1992 | Higgins | 257/669 |

FOREIGN PATENT DOCUMENTS 60-32807 2/1985 Japan.

*Primary Examiner*—Gerald P. Tolin
*Attorney, Agent, or Firm*—Bernard Tiegerman

[57] ABSTRACT

A chip carrier is disclosed which includes a chip carrier substrate and at least one semiconductor chip mounted in a flip chip configuration, via solder balls, on a circuitized surface of the chip carrier substrate. The solder balls are encapsulated in a first encapsulant having a composition which includes an epoxy. In addition, at least a portion of the circuitry on the circuitized surface is encapsulated in a second encapsulant having a composition which includes a urethane, and which composition is chosen so that the second encapsulant exhibits a modulus of elasticity which is equal to or less than about 10,000 psi. As a consequence, the second encapsulant exhibits neither internal cracks, nor interfacial cracks at the interface with the first encapsulant, nor does the second encapsulant delaminate from the circuitized surface, when the chip carrier is thermally cycled.

5 Claims, 1 Drawing Sheet

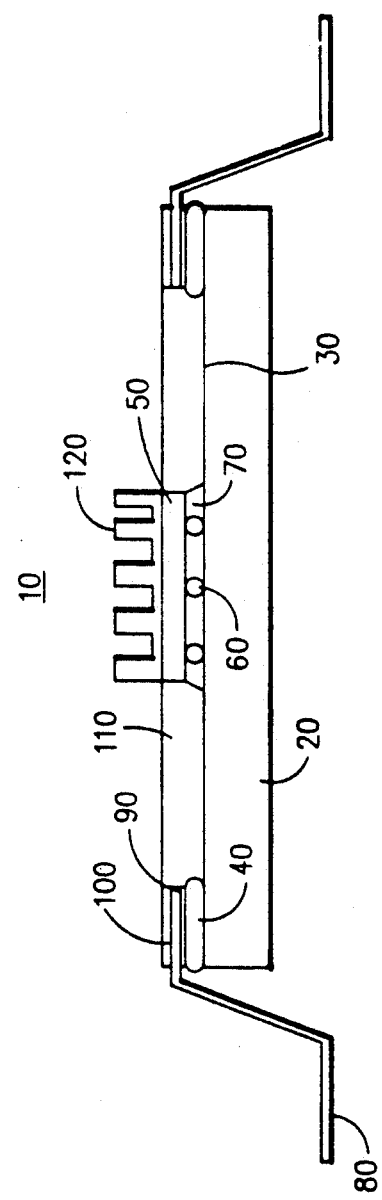

CHIP CARRIER WITH PROTECTIVE COATING FOR CIRCUITIZED SURFACE

BACKGROUND OF THE INVENTION

1. Field of the Invention

The invention pertains generally to chip carriers, and more particularly to a chip carrier having a circuitized surface which is at least partially covered by a protective, ultraviolet (UV) radiation cured coating.

2. Description of the Related Art

One type of semiconductor chip package includes one or more semiconductor chips mounted on a circuitized surface of a substrate, e.g., a ceramic substrate or a plastic substrate. Such a semiconductor chip package, conventionally termed a chip carrier, is usually intended for mounting on a printed circuit card or printed circuit board. If, for example, surface mounting is to be used, then the chip carrier will conventionally include a lead frame or edge clip which is mechanically and electrically connected to electrical contact pads formed around the periphery of the chip-bearing, circuitized surface of the substrate.

A relatively high density of chip connections is readily achieved by mounting one or more semiconductor chips on the circuitized surface of a chip carrier substrate in the so-called flip chip configuration. In this configuration, the chip or chips are mounted face-down on solderable metal pads on the substrate using solder balls. However, the coefficient of thermal expansion (CTE) of, for example, a silicon chip is significantly different from the CTE of a ceramic substrate or plastic substrate. As a consequence, if a chip carrier is subjected to thermal fluctuations, then the solder ball connections will be subjected to significant stresses, which tend to weaken, and reduce the fatigue life of, the solder ball connections. Significantly, this problem is readily overcome by encapsulating the solder balls in an encapsulant having a CTE which is within 30 percent of the CTE of the solder balls. Useful such encapsulants have a composition which includes, for example, an epoxy binder, e.g. a cycloaliphatic epoxide binder, and a filler, e.g. high purity fused or amorphous silica, as disclosed in U.S. Pat. No. 4,999,699, the disclosure of which is hereby incorporated by reference. As noted in this patent, the binder should have a viscosity at room temperature which is no greater than about 1000 centipoise and the filler should have a maximum particle size which is no greater than 31 microns. Moreover, the binder should constitute about 60 to about 25 percent by weight of the total of binder and filler, while the filler should constitute about 40 to about 75 percent by weight of the total.

The circuitry on the circuitized surface of a chip carrier substrate, and to a lesser extent the chip or chips mounted in a flip chip configuration on the circuitized surface, need to be protected from mechanical and environmental hazards. One technique for achieving such protection is to mount a ceramic cap over the chip or chips and at least a portion of the circuitry on the circuitized surface. While the use of such a ceramic cap for achieving mechanical and environmental protection is effective, its use significantly increases the cost of the chip carrier. Moreover, the presence of the ceramic cap precludes the possibility of directly mounting a heat sink on the chip or chips in order to dissipate the heat produced by the chip or chips. Rather, the heat sink is necessarily mounted on the ceramic cap, and a thermal grease must then be provided between the upper surface of each chip and the ceramic cap to achieve good thermal contact between the chip or chips and the heat sink. While this procedure is effective for dissipating heat, it would be more convenient if the heat sink could be directly mounted on the chip or chips.

It has been proposed that the circuitry on the circuitized surface of a chip carrier substrate be covered by a coating having a composition which includes an epoxy binder and a filler, in order to provide mechanical and environmental protection for the circuitry at a relatively low cost. Such filled epoxy coatings have been applied to the upper (non-circuit bearing) surfaces of chips and have proven to be useful. However, it has been recognized that to be useful as a protective coating for the circuitry on the circuitized surface of a chip carrier, such a filled epoxy coating would have to : (1) be capable of withstanding a standard, accelerated thermal aging test, in which the coating is thermally cycled between 0 degrees Centigrade (C.) and 100 degrees C., at a frequency of three cycles per hour, for at least 2,000 cycles, without exhibiting internal cracks or cracks at the interface with the solder ball encapsulant, which cracks are undesirable because they allow water and other undesirable chemicals to enter and corrode circuitry; (2) be hydrophobic, for the reason given above; (3) be capable of withstanding a second standard thermal cycling test, usually referred to as the "ship shock" test, in which the coating is thermally cycled from −40 degrees C. to +65 degrees C., at a frequency of one cycle per hour, for at least ten cycles, without cracking or delaminating from the chip carrier substrate; (4) exhibit a low concentration of ions, typically achieved by ensuring that the concentration of chloride ions is less than ten parts per million, to avoid circuitry corrosion and conductor migration, the latter phenomenon leading to undesirable short circuits; and (5) be relatively quickly, and thus conveniently, cured.

Significantly, when filled epoxy coatings of the type referred to above have been extended from the upper surfaces of chips on the circuitized surfaces of chip carriers to the circuitry on the circuitized surfaces of chip carrier substrates of significant size, e.g., 36 mm×36 mm, these coatings have proven not to be useful. That is, when these coatings have been subjected to the accelerated thermal aging test, described above, they invariably exhibited internal cracks or cracks at the interface with the solder ball encapsulant. In addition, these coatings are generally hydrophobic. Moreover, when subjected to the "ship shock" test, described above, these coatings have invariably cracked or delaminated from the chip carrier substrates. Further, these coatings are cured by being baked in an oven for a significant period of time, e.g., three hours, which is time consuming and inconvenient.

Thus, those engaged in the development of chip carriers have sought, thus far without success, protective coatings for the circuitry on the circuitized surfaces of chip carriers which are: (1) relatively inexpensive; (2) capable of withstanding standard thermal cycling tests without cracking and without delaminating to provide effective mechanical and environmental protection for the circuitry; (3) hydrophobic; (4) exhibit a low centration of ions, exemplified by the concentration of chloride ions being less than ten parts per million; (5) relatively quickly and therefore conveniently cured; and (6) permit heat sinks to be directly mounted on chips.

SUMMARY OF THE INVENTION

The invention involves the finding that the epoxy coatings previously proposed as protective coatings for the circuitry on the circuitized surfaces of chip carriers all had relatively high moduli of elasticity, i.e., moduli of elasticity greater than about 10,000 psi (69 MPa), at room temperature (25 degrees C.). As a consequence, these coatings lacked the flexibility needed to withstand the stresses associated with the thermal cycling tests, described above, which led to cracking and delamination.

The invention also involves the finding that compositions which include appropriately chosen, and appropriate relative amounts of, acrylated urethane oligomer, acrylated monomer and photoinitiator are relatively quickly cured, e.g., cured within 5 seconds, using UV radiation to yield relatively inexpensive, hydrophobic coatings having moduli of elasticity equal to or less than about 10,000 psi at room temperature. As a consequence, these coatings readily withstand thermal cycling tests without cracking or delaminating. In addition, these coatings exhibit chloride ion concentrations less than ten parts per million, and therefore do not cause ion-induced corrosion and migration. Moreover, if these coatings are not applied to the upper surfaces of chips on the circuitized surfaces, then heat sinks are readily directly mounted on the chips.

BRIEF DESCRIPTION OF THE DRAWING(S)

The invention is described with reference to the single accompanying drawing, which is a cross-sectional view of a preferred embodiment of a chip carrier including a protective coating covering at least a portion of the circuitized surface of the chip carrier, in accordance with the invention.

DETAILED DESCRIPTION OF THE PREFERRED EMBODIMENT

The invention involves a chip carrier including a chip carrier substrate, e.g., a ceramic substrate or a plastic substrate, having a circuitized surface on which is mounted at least one semiconductor chip in a flip chip configuration. The solder ball connections between the at least one semiconductor chip and the chip carrier substrate are encapsulated in an encapsulant having a composition which includes, for example, an epoxy, and having a CTE which is within 30 percent of the CTE of the solder balls. In addition, at least a portion of the circuitry on the circuitized surface is covered with a protective, relatively inexpensive coating having a composition which is chosen, in accordance with the invention, so that this coating: (1) readily withstands the thermal cycling tests, described above, without exhibiting any internal cracks or interfacial cracks at the coating/solder ball encapsulant interface, and without delaminating, when viewed under a 10× optical microscope; (2) is hydrophobic; (3) exhibits a chloride ion concentration less than ten parts per million; (4) is relatively quickly and conveniently cured using UV radiation; and (5) permits heat sinks to be directly mounted onto chips.

As depicted in the single accompanying drawing, a preferred embodiment of a chip carrier 10, in accordance with the invention, includes a substrate 20, e.g., a ceramic substrate, such as an alumina substrate, or a plastic substrate. This substrate 20 has a circuitized surface 30, including circuit lines (not shown) and electrical contact pads 40 of, for example, copper. At least one semiconductor chip 50, e.g., a silicon chip, is mounted in a flip chip configuration on the circuitized surface 30 using solder balls 60 having a composition which includes, for example, three percent (by weight) tin and ninety seven percent (by weight) lead. To strengthen, and thereby increase the fatigue life of, the solder ball connections 60 between the chip 50 and substrate 20, the solder balls 60 are encapsulated in an encapsulant 70 having a CTE which is within 30 percent of the CTE of the solder balls 60. The composition of the solder ball encapsulant 70 includes, for example, an epoxy binder, e.g., a cycloaliphatic polyepoxide binder, and a filler, e.g., high purity fused or amorphous silica, as disclosed in U.S. Pat. No. 4,999,699.

The chip carrier 10 also includes a metallic lead frame or edge clip 80 of, for example, copper, which is mechanically and electrically connected to the contact pads 40. Preferably, as disclosed in U.S. application Ser. No. 07/838,613 filed by S. R. Engle et al on Feb. 18, 1992, the disclosure of which is hereby incorporated by reference, each of the mechanical/electrical connections between the lead frame or edge clip 80 and the contact pads 40 includes a region of solder 90, having a composition which includes, for example, ten percent (by weight) tin and ninety percent (by weight) lead. In addition, each solder connection between a contact pad 40 and the lead frame or edge clip 80 is at least partially, and preferably totally, encapsulated in a region of material 100. Significantly, in accordance with the teachings of the U.S. application Ser. No. 07/838,613, the composition of the material region 100 is chosen so that after the combination of the solder region 90 and material region 100 is subjected to sinusoidal thermal cycling between 0 degrees C. and 100 degrees C., at a frequency of three cycles per hour, for at least 2,000 cycles, the solder region 90 exhibits an increase in electrical resistance less than 200 milliohms. This is achieved, in accordance with the teachings of the U.S. application Ser. No. 07/838,613, by employing a material region 100 comprised of an at least partially filled epoxy resin having a CTE which is within +/−30 percent of the CTE of the solder region 90. One such useful epoxy resin is a cyclohexyldiepoxide resin partially filled with silica filler material, which is sold under the trade name Hysol FP0045 by the Dexter Corporation of California, U.S.A.

In accordance with the teachings of the present invention, with the exception of the contact pads 40, at least a portion, and preferably all, of the circuitry on the circuitized surface 30, exterior to the encapsulated solder balls 60, is covered by, and thereby encapsulated in, a coating 110, which serves to protect the covered circuitry from mechanical and environmental hazards. This coating 110 also contacts, and at least partially encircles, the encapsulant 70 encapsulating the solder balls 60. As discussed more fully below, the composition used to form the coating 110 is dispensed onto the circuitized surface 30 using a syringe, and readily flows over this surface to cover exposed circuitry after being dispensed. In addition, this composition is thereafter relatively quickly and conveniently cured using UV radiation.

The composition dispensed to form the coating 110, according to the present invention, includes three components: (1) an acrylated urethane oligomer; (2) an acrylated monomer; and (3) a photoinitiator. The presence of the acrylated urethane oligomer tends, among other things, to make the corresponding coating 110 hydrophobic. The acrylated monomer serves as a diluent for the acrylated urethane oligomer and undergoes cross-linking to the latter when the dispensed composition is subjected to UV radiation. The presence of the photoinitiator makes such cross-linking possible under the influence of the UV radiation.

A variety of acrylated urethane oligomers, acrylated monomers and photoinitiators are useful in the invention. In this regard, it has been found that it is primarily the combination of oligomer and monomer which determines the elasticity of the corresponding coating 110. It has also been found that useful elasticity-producing combinations of acrylated urethane oligomer and acrylated monomer are readily found empirically by forming compositions from such oligomers and monomers (and photoinitiators), curing these compositions using UV radiation and then measuring the modulus of elasticity of the resulting coating 110 at room temperature using, for example, a conventional tensile test. If the measured modulus is equal to or less than about 10,000 psi, then the corresponding combination of oligomer and monomer is useful in the invention, at least in so far as to yield a coating 110 having useful elastic properties.

It has further been found that it is the combination of oligomer, monomer and photoinitiator which determines the concentration of chloride ions in the resulting coating 110, and therefore the degree of ion-induced corrosion and migration. Moreover, useful combinations of oligomer, monomer and photoinitiator are readily empirically found by forming corresponding compositions on circuitized surfaces of chip carriers, curing these compositions using UV radiation and then measuring the ability of the resulting coating to prevent corrosion. That is, the corrosion behavior is ascertained by exposing the coating-covered circuitized surface to an air environment at 85 degrees C., at 80 percent relative humidity, for 1,000 hours. An increase in the DC electrical resistance of any circuit line of 100 percent or more is an indication of significant corrosion activity and is considered unacceptable, for purposes of the present invention. The migration behavior is ascertained by exposing the coating-covered circuitized surface to an air environment at 85 degrees C., at 80 percent relative humidity, under the continuous influence of a ten volt bias, for 1,000 hours. A DC electrical resistance between any two adjacent circuit lines less than ten megohms is an indication of significant migration behavior and is considered unacceptable, for purposes of the present invention.

In addition to the requirements on ion-induced corrosion and migration, a photoinitiator, to be useful in the present invention, must enable the useful acrylated urethane oligomers to undergo essentially complete cross-linking with the useful acrylated monomers under the influence of UV radiation, at the intensities and over the time periods discussed below. Such useful photoinitiators are readily found empirically by initially adding a photoinitiator to a composition which includes a useful acrylated urethane oligomer and a useful acrylated monomer, and subjecting the resulting composition to UV radiation having the intensities, and for the durations, specified below, to produce a first coating sample. The fracture stress exhibited by this first coating sample, which is a measure of the degree of cross-linking, is measured via, for example, a conventional tensile test. A second such coating sample is then produced by subjecting another composition, including the same oligomer, monomer and photoinitiator, to the same UV radiation, at the same intensity but for a longer exposure time, or at a higher intensity but for the same exposure time. If the measured fracture stress of the second coating sample is greater than that of the first coating sample, then this indicates that the second coating sample has undergone additional cross-linking. If, on the other hand, the fracture stress of the second coating sample is unchanged, then the first coating sample is assumed to have achieved complete, or essentially complete, cross-linking. Provided the UV intensity and exposure time needed to achieve such complete cross-linking falls within the ranges given below, then the corresponding photoinitiator is useful to the present invention. Otherwise, the photoinitiator is not useful to the present invention.

Included among the useful, acrylated urethane oligomers found using the above-described procedures are the acrylated urethane oligomers sold under the trade names ZL2196 and ZL1365 by Morton International, Inc., of Chicago, Ill. Similarly, it has been found that the acrylated monomers isobornyl acrylate and 2-hydroxypropyl acrylate are useful in the invention, in combination with either ZL2196 or ZL1365 acrylated urethane oligomer. Moreover, it has been found that the following three photoinitiators are useful with any combination of the above oligomers and monomers:

1) 2-methyl-1-(4-(methylthio)-phenyl)-2-morpholino-propanone;

2) isopropylthioxanthone; and 3) 2-hydroxy-2-methyl-1-phenylpropan-1-one.

As noted above, the relative amounts of the three components of the useful compositions are also important. For example, the acrylated urethane oligomer should constitute about 35 percent (by weight) to about 75 percent (by weight) of a useful composition, and should preferably constitute about 65 percent (by weight) of the composition. Amounts less than about 35 percent are undesirable because the corresponding coating 110 exhibits a modulus of elasticity higher than about 10,000 psi and, as a consequence, exhibits internal and interfacial cracks, and delaminates, when subjected to the thermal cycling tests, described above. On the other hand, amounts greater than about 75 percent are undesirable because the corresponding composition exhibits an undesirably high viscosity, which makes it difficult to dispense the composition with a syringe and results in undesirably little flow of the composition over exposed circuitry.

The acrylated monomer should correspondingly constitute about 63.5 percent (by weight) to about 22.5 percent (by weight) of a useful composition. Amounts outside this range are undesirable for the reasons given above.

The photoinitiator should correspondingly constitute about 1.5 percent (by weight) to about 2.5 percent (by weight) of a useful composition. Amounts less than about 1.5 percent are undesirable because they result in insufficient cross-linking between the oligomer and the monomer. Amounts greater than about 2.5 percent are unnecessary because 2.5 percent is sufficient to achieve complete cross-linking.

As mentioned above, the useful compositions, as defined above, are readily dispensed via a syringe onto the circuitized surface 30 of the substrate 20. These compositions readily flow over the surface 30 to cover exposed circuitry and, under the influence of capillary action, readily flow up the sides of the solder ball encapsulant 70 to cover and encircle this encapsulant.

After being dispensed, the useful compositions are readily cured using UV radiation. The useful UV wavelengths include wavelength bands from 200 to 400 nanometers. Useful UV intensities range from about 5.5 to about 6.5 joules per square centimeter, with corresponding exposure times ranging from about 5 to about 30 seconds. UV intensities less than about 5.5 joules per square centimeter are undesirable because they result in insufficient cross-linking between the oligomer and the monomer. UV intensities greater than about 6.5 joules per square centimeter are unnecessary because complete cross-linking occurs at lower intensities and, in fact, significantly higher intensities lead to bond scission, which is counterproductive. A commercially available source of UV radiation, capable of emitting UV radiation at the intensities and for the durations specified above is, for example, a UV curing system sold by Fusion UV Curing Systems of Rockville, Md., equipped with D and H lamps, as denominated by this supplier.

The thickness of the coating 110 preferably exceeds that of the underlying, protected circuitry by about 0.020 inches. While greater coating thicknesses are useful, effective machanical and environmental protection is readily achieved at the thickness specified above.

After a useful composition is dispensed and cured, as described above, the resulting coating 110 readily withstands thermal cycling from 0 degrees C. to 100 degrees C., at a frequency of three cycles per hour, for at least 2,000 cycles without exhibiting internal or interfacial cracks, when viewed under a 10× optical microscope. This thermal cycling is, of course, performed in an oven having a control system which does not permit perfect adherence to the above thermal cycling specification. Rather, in practice, each complete thermal cycle has a duration of 20+/−2 minutes (rather than precisely 20 minutes). In addition, the rise time from 10 degrees C. to 90 degrees C. is 6+3/−2 minutes, and the fall time from 90 degrees C. to 10 degrees C. is also 6+3/−2 minutes. Moreover, the oven reaches a peak temperature of 100+/−10 degrees C., where the corresponding dwell time is 4+/−2 minutes. Further, the oven reaches a minimum temperature of 0+/−10 degrees C., where the corresponding dwell time is also 4+/−2 minutes. Thus, for purposes of the present invention, the former (perfect) thermal cycling specification is to be interpreted as denoting the latter (practical) thermal cycling specification.

A coating 110, formed in accordance with the present invention, also readily withstands the "ship shock" test, in which the coating is thermally cycled from −40 degrees C. to 65 degrees C., at a frequency of one cycle per hour, for at least ten cycles, without delaminating from the circuitized surface 30 and without cracking, when viewed under a 10× optical microscope. As before, this "ship shock" test is performed in an oven having a control system which does not permit perfect adherence to the "ship shock" thermal cycling specification. Rather, in practice, the minimum cycling temperature is −40+/−5 degrees C., whereas the maximum cycling temperature is +65+/−5 degrees C. In addition, while the total number of thermal cycles is at least ten, the cycling frequency is 1+/−0.1 cycles per hour (rather than precisely one cycle per hour). Moreover, the dwell time at the highest and lowest temperatures is 25+/−7 minutes, while the rate of increase or decrease in temperature, away from the highest and lowest temperatures, is 15 degrees C. per minute. As before, for purposes of the present invention, the former (perfect) thermal cycling specification is to be interpreted as denoting the latter (practical) thermal cycling specification.

In addition to being applied to the circuitized surface 30, a useful composition is also readily applied, via a syringe, to the upper, exposed surface of the chip 50 so that, after UV curing, a continuous coating is formed which protects both the chip 50 and the circuitized surface 30 from mechanical and environmental hazards. If, however, no coating is formed on the upper surface of the chip 50, then a heat sink 120 is readily directly mounted on the upper surface of the chip 50, as depicted in the sole accompanying drawing.

While the invention has been particularly shown and described with reference to a preferred embodiment thereof, it will be understood by those skilled in the art that various changes in form and details may be made therein without departing from the spirit and scope of the invention.

We claim:

1. A chip carrier, comprising:
   a substrate including a surface bearing electrical circuitry;
   at least one semiconductor chip mounted on said surface via electrically conductive solder balls at least partially encapsulated in a first encapsulant having a composition which includes an epoxy, a coefficient of thermal expansion (CTE) of said first encapsulant being within 30 percent of a CTE of said solder balls;
   a second encapsulant which covers and thereby encapsulates at least a portion of said electrical circuitry on said substrate surface and which contacts and at least partially encircles at least a portion of said first encapsulant, Characterized In That
   said second encapsulant has a composition which includes a urethane and said composition is chosen so that said second encapsulant exhibits a modulus of elasticity equal to or less than about 10,000 psi at 25 degrees C.

2. The chip carrier of claim 1, wherein said second encapsulant also covers and thereby encapsulates at least a portion of an upper, exposed surface of said at least one semiconductor chip.

3. The chip carrier of claim 1, further comprising a heat sink directly mounted on an upper, exposed surface of said at least one semiconductor chip.

4. A chip carrier, comprising:
   a substrate including a surface bearing electrical circuitry;
   at least one semiconductor chip mounted on said surface via electrically conductive solder balls at least partially encapsulated in a first encapsulant having a composition which includes an epoxy, a coefficient of thermal expansion (CTE) of said first encapsulant being within 30 percent of a CTE of said solder balls;
   a second encapsulant which covers and thereby encapsulates at least a portion of said electrical circuitry on said substrate surface and which contacts and at least partially encircles at least a portion of said first encapsulant, Characterized In That
   said second encapsulant has a composition which includes a urethane, said composition of said second encapsulant being chosen so that, when viewed under a 10× optical microscope, said second encapsulant exhibits neither internal cracks, nor cracks at an interface between said first and second encapsulants, when said chip carrier is subjected to thermal cycling between 0 degrees C. and 100 degrees C., at a frequency of three cycles per hour, for 2,000 cycles.

5. A chip carrier comprising:

a substrate including a surface bearing electrical circuitry;

at least one semiconductor chip mounted on said surface via electrically conductive solder balls at least partially encapsulated in a first encapsulant having a composition which includes an epoxy, a coefficient of thermal expansion (CTE) of said first encapsulant being within 30 percent of a CTE of said solder balls;

a second encapsulant which covers and thereby encapsulates at least a portion of said electrical circuitry on said substrate surface and which contacts and at least partially encircles at least a portion of said first encapsulant, Characterized In That said second encapsulant has a composition which includes a urethane, said composition of said second encapsulant being chosen so that, when viewed under a 10× optical microscope, said second encapsulant exhibits neither delamination from said substrate, nor cracking, when said chip carrier is thermally cycled from −40 degrees C. to +65 degrees C., at a frequency of one cycle per hour, for ten cycles.

* * * * *